(12) United States Patent
Takita et al.

(10) Patent No.: US 6,404,692 B1
(45) Date of Patent: *Jun. 11, 2002

(54) SEMICONDUCTOR MEMORY (75) Inventors: Masato Takita; Yuichi Uzawa; Shinichi Yamada; Masato Matsumiya, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/539,615

(22) Filed: Mar. 31, 2000

(30) Foreign Application Priority Data

Jun. 1, 1999 (JP) .......................................... 11-153272

(51) Int. Cl.⁷ ................................................. G11C 7/00
(52) U.S. Cl. ............................ 365/230.03; 365/189.05; 365/230.08; 365/230.06
(58) Field of Search ........................ 365/189.01, 189.05, 365/230.03, 230.08, 230.06

(56) References Cited

U.S. PATENT DOCUMENTS

| 5,363,330 A | * | 11/1994 | Kobayashi et al. | .... 365/189.05 |
| 5,970,017 A | | 10/1999 | Morigami | .............. 365/230.06 |
| 6,055,206 A | * | 4/2000 | Tanizaki et al. | ........ 365/230.06 |
| 6,078,542 A | * | 6/2000 | Tomishima | ............ 365/230.03 |
| 6,084,821 A | * | 7/2000 | Hoshita | .................. 365/230.06 |

* cited by examiner

*Primary Examiner*—Vu A. Le
*Assistant Examiner*—Anh Phung
(74) *Attorney, Agent, or Firm*—Arent Fox Kintner Plotkin & Kahn, PLLC (57) ABSTRACT A semiconductor memory selects desired one of word lines, which belong to banks each including a memory cell array, on the basis of a main WD select signal (mwd) and sub-WD select signals (swdx and swdz) determined in accordance with an address. The main WD select signal is a pulse signal. A latch circuit latches, for a predetermined time, the state of the sub-WD select signals having changed on the basis of state changes of the main WD select signal. This allows the banks to share the main WD select signal. Since a main WD signal generator is thus shared by the banks, the area of a chip can be reduced.

13 Claims, 8 Drawing Sheets

SEMICONDUCTOR MEMORY

BACKGROUND OF THE INVENTION

1. Field of the Invention

The present invention relates to semiconductor memories, particularly to a semiconductor memory such as a synchronous dynamic random-access memory (to be referred to as SDRAM hereinafter) having a cell array including banks and capable of independently controlling these banks.

2. Description of the Related Art

Figure 1:
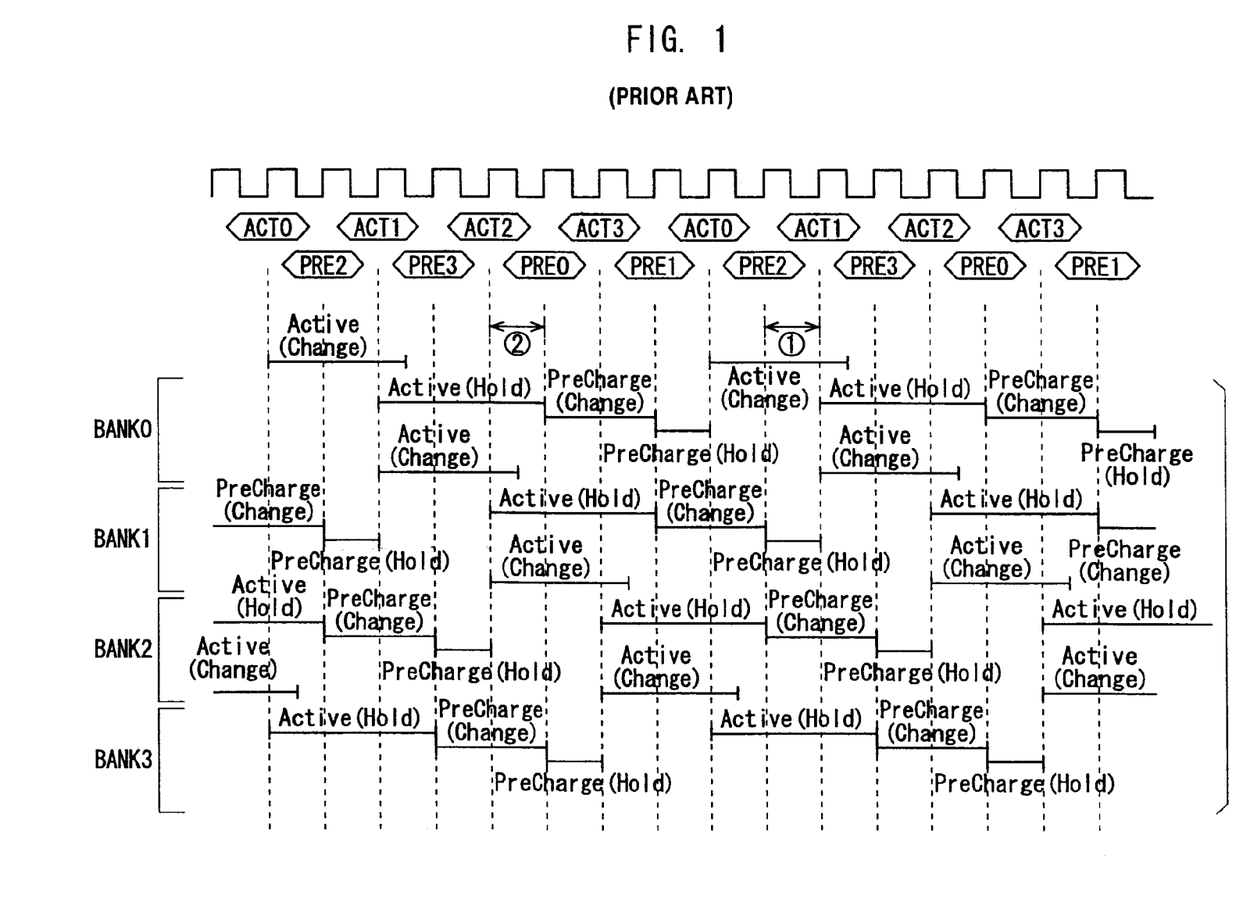
FIG. 1 is a timing chart showing operations when banks are individually controlled.

In a semiconductor memory such as SDRAM, one chip is divided into banks, which are controlled independently of each other. FIG. 1 shows a timing chart when four banks (Bank0 to Bank3) are individually controlled.

In this timing chart of FIG. 1, the state of a block in each bank is always an active or pre-charge state, and these active and pre-charge states are alternately switched. In the active state, a predetermined block in a bank is activated to enable data read and write. In the pre-charge state, a block in an activated bank is restored to the state before being activated.

When a bank is in the active state, a specific word line in the bank rises to enable data write or read to a particular memory cell connected to this word line. In the pre-charge state, no word line rises, so neither data write nor read to a memory cell in the bank is possible.

FIG. 1 shows a case in which the pre-charge and active states are switched most frequently when write and read operations to a memory are performed. A block in each bank is set in the active state when receiving active commands (ACT0 to ACT3) and in the pre-charge state when receiving pre-charge commands (PRE0 to PRE3).

Operations of each bank are as follows. Operations performed in the active state are: (A1) "block selection" for selecting a sense amplifier column to be activated; (A2) "word line selection" for selecting a word line in a block; and (A3) "sense amplifier activation" for amplifying read data. Operations performed in the pre-charge state are: (P1) "word line reset" for setting a word line in a non-selected state; and (P2) "block selection release" for setting a sense amplifier in a non-active state and resetting a bit line to a standby state.

A semiconductor memory having four banks can receive each command in a cycle shown in FIG. 1. In a period indicated by ① in FIG. 1, while an operation for switching bank 0 (Bank0) from the pre-charge state to the active state is performed, a pre-charge operation of bank 2 (Bank2) is started, and the active state of bank 3 (Bank3) and the pre-charge state of bank 1 (Bank1) are maintained. In a period indicated by ②, while a pre-charge operation of bank 3 (Bank3) is performed, an active operation of bank 2 (Bank2) is started, and the active states of bank 0 (Bank0) and bank 1 (Bank1) are maintained.

In SDRAM as described above, while the present state of a bank is maintained, a desired block in another bank can be switched to the active state, and a block in still another bank can be switched to the pre-charge state. That is, the banks can be operated and controlled independently of each other.

To this end, circuits such as sense amplifiers and sub-word drivers arranged in a cross portion, called an SS-Cross portion, between a sense amplifier group and a sub-word decoder group and various circuits for controlling these circuits must be so designed as to be able to control these banks independently.

Figure 2:
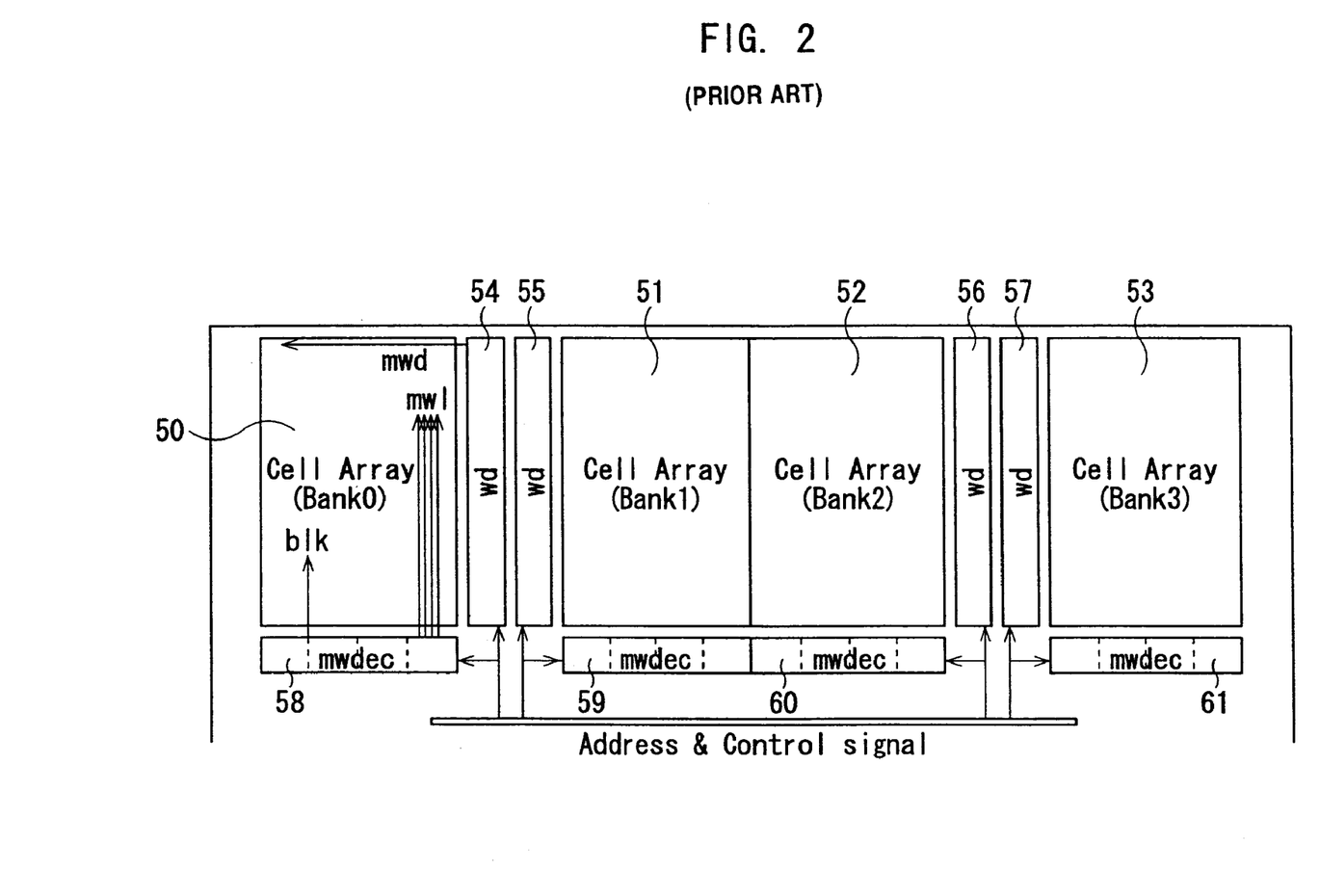
FIG. 2 is a block diagram showing an outline of the arrangement of SDRAM for performing a four-bank operation.
Figure 3A:
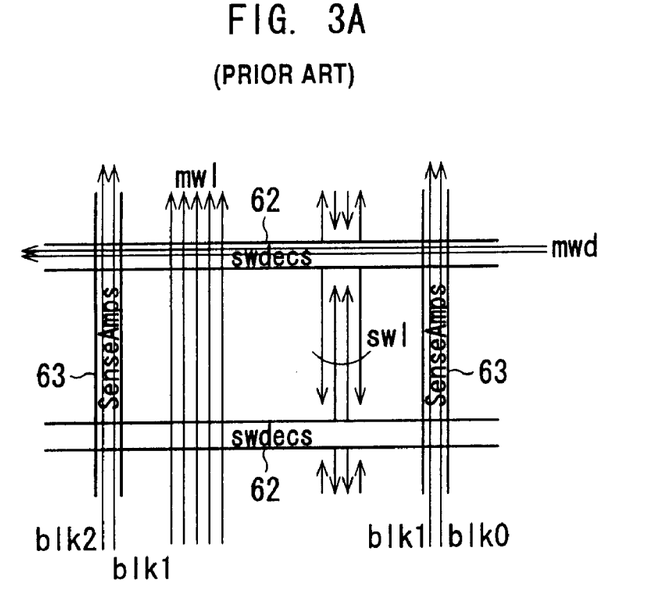
FIGS. 3A and 3B are views showing, in enlarged scales, the internal arrangements of one bank in the SDRAM shown in FIG. 2.
Figure 3B:
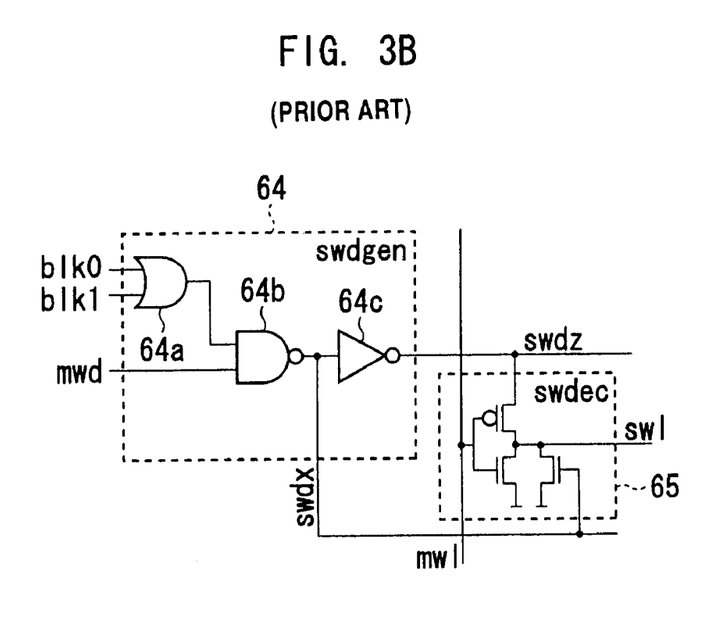

FIG. 2 is a block diagram showing the arrangement of a cell array block of SDRAM for performing a four-bank operation. FIGS. 3A and 3B are schematic views showing details of the interior of the cell array shown in FIG. 2. The arrangement of SDRAM for performing a four-bank operation will be briefly described below with reference to FIGS. 2, 3A, and 3B. Banks (Bank0 to Bank3) 50 to 53 are provided with word drivers (wd) 54 to 57 as power generators for independently controlling these banks and setting a word line of a desired block in the active state. These word drivers 54 to 57 supply a main WD select signal (mwd) to the adjacent banks 50 to 53. The banks 50 to 53 are also provided with main word decoders (mwdec) 58 to 61. These main word decoders 58 to 61 are connected to main select lines (mwl).

A word line is selected as follows in each of these banks 50 to 53. That is, in accordance with an input row address, the main word decoders 58 to 61 select a desired main select line (mwl). Also, a sub-word decoder (swdec in FIGS. 3A and 3B) driven on the basis of an output main WD select signal (mwd) from the word drivers 54 to 57 selects a desired one of sub-select lines (swl), which belongs to the selected main select line (mwl). Additionally, by selecting a bit line (not shown) in accordance with an input column address, a memory cell at the intersection of the word line and the bit line is selected.

FIG. 3A is a view showing, in an enlarged scale, the internal arrangement of one bank (e.g., Bank0) in the SDRAM shown in FIG. 2. FIG. 3B is a view showing, in a further enlarged scale, a sub-WD signal generator (swdgen) 64 and a sub-word decoder (swdec) 65 connected to this sub-WD signal generator 64 arranged in a cross portion (SS-Cross portion) between a sub-word decoder group (swdecs) 62 and a sense amplifier group (senseAmps) 63 shown in FIG. 3A.

The bank is divided into blocks (four blocks as indicated by the dotted lines in mwdec shown in FIG. 2) along the word line direction. As shown in FIG. 3A, in each block cell array units are formed with sub-word decoder groups 62 and sense amplifier groups 63 perpendicular to each other. Sub-select lines (swl) run from the opposing sub-word decoder groups 62 in an interdigitated pattern. The sense amplifier groups 63 have a function of amplifying an output from a bit line (not shown) running in a direction perpendicular to the sub-select lines (swl). On these sense amplifier groups 63, block signal lines for transmitting block select signals (blk0, blk1, . . .) run in the direction that the sense amplifier groups 63 run.

The sub-WD signal generator 64 shown in FIG. 3B includes an OR gate 64a for performing OR operation of select signals (blk0 and blk1) of adjacent blocks, a NAND gate 64b for performing NAND operation of the output from the OR gate 64a and the main WD select signal (mwd) from the word driver 54, and an inverter 64c for inverting the output from the NAND gate 64b. Complementary signals at the input and output of this inverter 64c are sub-WD select signals (swdz and swdx).

Each of these complementary sub-WD select signals (swdz and swdx) generated by the sub-WD signal generator 64 are input to sub-word decoders 65 connected to this sub-WD signal generator 64. Of these sub-word decoders 65, a sub-word decoder 65 connected to a main select line (mwl) selected by the main word decoder 58 activates a sub-select line (swl). Consequently, a desired memory cell is selected, and data write or read is performed.

Figure 4:
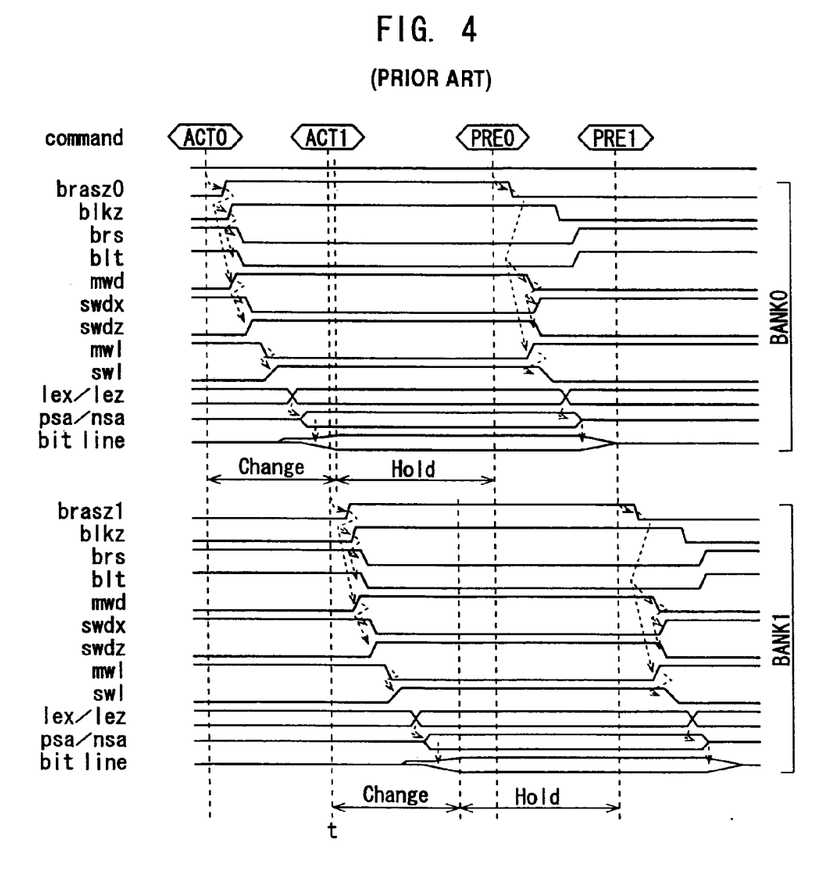
FIG. 4 is a timing chart showing the operations of signals in two banks shown in FIG. 2

FIG. 4 is a timing chart showing signals for controlling the bank 50 (Bank0) and the bank 51 (Bank1). Major ones of these signals shown in FIG. 4 will be described below.

When the bank 50 accepts the active command (ACT0), a signal bras0z rises. This signal bras0z indicates whether the bank is in the active state or the pre-charge state. During a period in which the corresponding bank is in the active state, the signal bras0z maintains "H". Upon receiving this "H" status signal bras0z, a block select signal (blkz) of a block to which a memory cell to be selected belongs, rises.

Also, when receiving the "H" status signal bras0z, a main WD select signal (swl) selected in accordance with a row address rises. Additionally, the sub-WD signal generator 64 activates the sub-WD select signals (swdz and swdx) by logically operating the "H" main WD select signal (mwd) and the block select signal (blkz).

A main select line (mwl) falls to "L" when selected by the main word decoder 58 in accordance with a row address. The signal of this main select line (mwl) that was fallen to "L" upon being selected and the activated sub-WD select signals (swdz and swdx) described above activate a sub-select line (swl) of a memory cell to be selected by the corresponding sub-word decoder 65. After that, write or read to the memory cell is performed via a bit line corresponding to the memory cell.

In the above related art, however, as shown in FIG. 2, independently to control the banks 50 to 53 the word drivers 58 to 61 must be provided in one-to-one correspondence with these banks 50 to 53. That is, circuits having the same function exist in one-to-one correspondence with these banks 50 to 53. This increases the area occupied by the layer of transistors corresponding to the word drivers 58 to 61. Additionally, control lines for the same system are ran to these banks 50 to 53 to increase the area of the wiring layer. This results in the problem of an increased chip area.

Also, the presence of circuits having the same function increases the current driving load, resulting in an increased consumption current. Furthermore, the increase in the driving load decreases the driving speed.

SUMMARY OF THE INVENTION

The present invention has been made in consideration of the above situation, and aims to be able to reduce, in a semiconductor memory capable of independently controlling banks, the chip size by minimizing the area of a circuit for controlling each bank, and to reduce the consumption current by reducing the load of a current flowing in the control circuit.

A semiconductor memory according to the present invention comprises a plurality of banks, each of which includes memory cells, and a word line drive circuit selecting one of word lines in the banks in response to first and second select signals produced in accordance with an address. In the semiconductor memory, the first select signal is a pulse signal, and a state of the second select signal which has changed in response to a state change of the first select signal is maintained for a predetermined time in a latch circuit.

Preferably, a first circuit shared by the banks supplies the first select signal to each bank.

Preferably, the first circuit is disposed in substantially the center of the whole region where the banks are arranged.

Preferably, a latch circuit is set in an active state by application of the pulse signal, and maintains the active state until an initiation of a pre-charge operation in the banks.

Preferably, the latch circuit is formed in a second circuit for generating the second select signal.

Preferably, the latch circuit is formed in a second circuit for generating the second select signal, at the corner of a sense amplifier for driving a bit line connected to the memory cells and a word decoder for activating the desired word line in response to the second select signal.

Since the present invention comprises the above technical means, each pulse of the first select signal generated is supplied to the banks. Accordingly, the second select signals of these banks are controlled by one first select signal. Additionally, the state of the second select signals which changes in accordance with the pulse supplied to each bank is maintained for a predetermined time in the bank. Hence, even after a pulse of the first select signal rises, the bank is kept activated, so data can be read from and written in these banks independently of each other.

In the present invention, the first select signal is a pulse signal, and the state of the second select signals which has changed in accordance with the first select signal is maintained for a predetermined time. This permits a circuit for generating the first select signal to be shared by banks. Therefore, it is possible to reduce the chip area of the semiconductor memory and reduce the consumption current.

DETAILED DESCRIPTION OF THE PREFERRED EMBODIMENT

Figure 5:
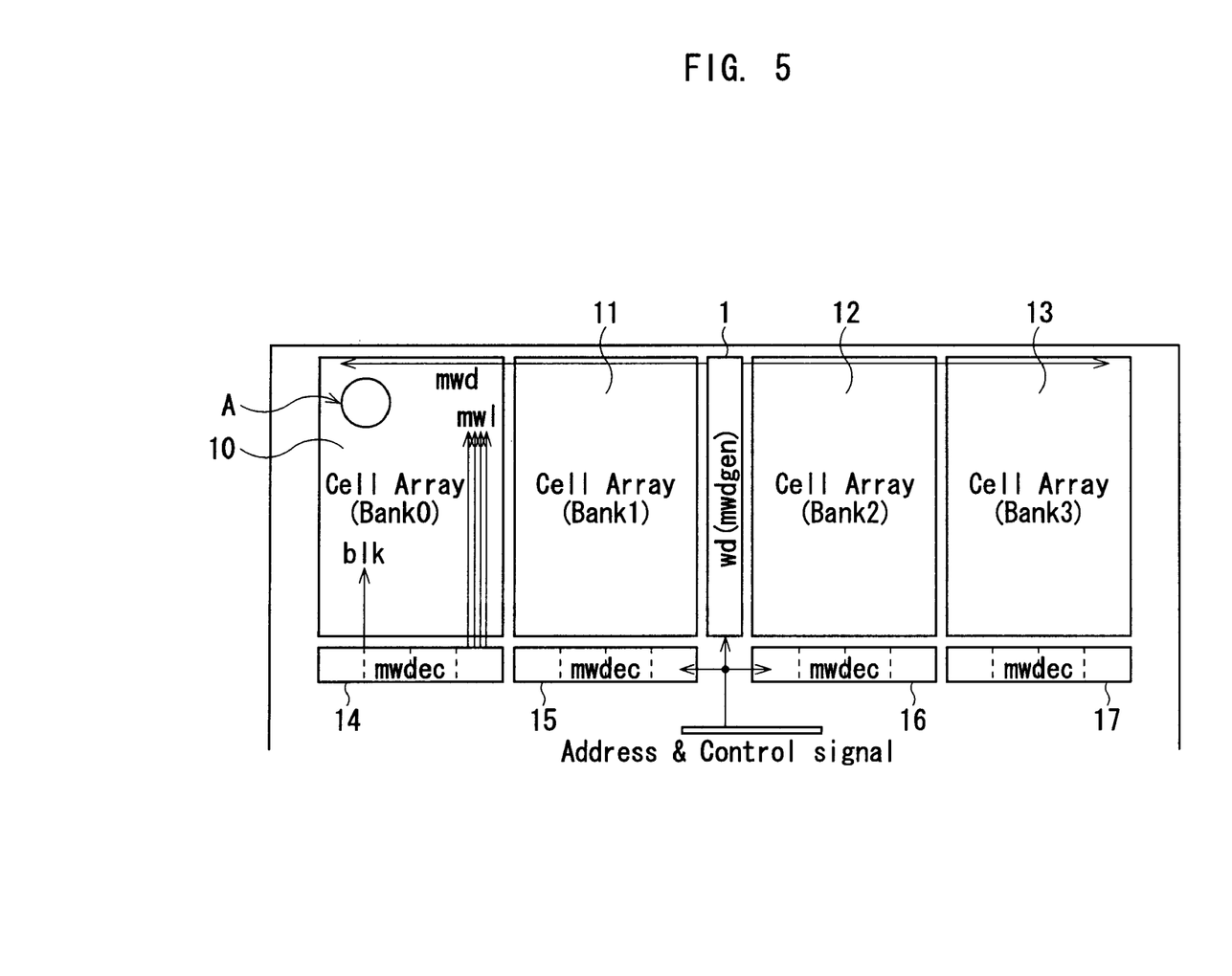
FIG. 5 is a block diagram showing the main components of SDRAM as a semiconductor memory according to one embodiment of the present invention.

One embodiment of the present invention will be described below with reference to drawings. FIG. 5 is a block diagram showing the main components of SDRAM as a semiconductor memory according to the embodiment of the present invention. This SDRAM shown in FIG. 5 performs independent operations of four banks like that shown in FIG. 2.

As shown in FIG. 5, banks (Bank0 to Bank3) 10 to 13 are arranged close to each other, and a common word driver (main WD signal generator (mwdgen)) 1 of all these banks 10 to 13 is formed between the banks 11 and 12. A main WD select signal (mwd) generated by this main WD signal generator 1 is supplied to these banks 10 to 13. Also, main word decoders (mwdec) 14 to 17 are formed in one-to-one correspondence with the banks 10 to 13. These main word decoders 14 to 17 are connected to main select lines (mwl).

Figure 6A:
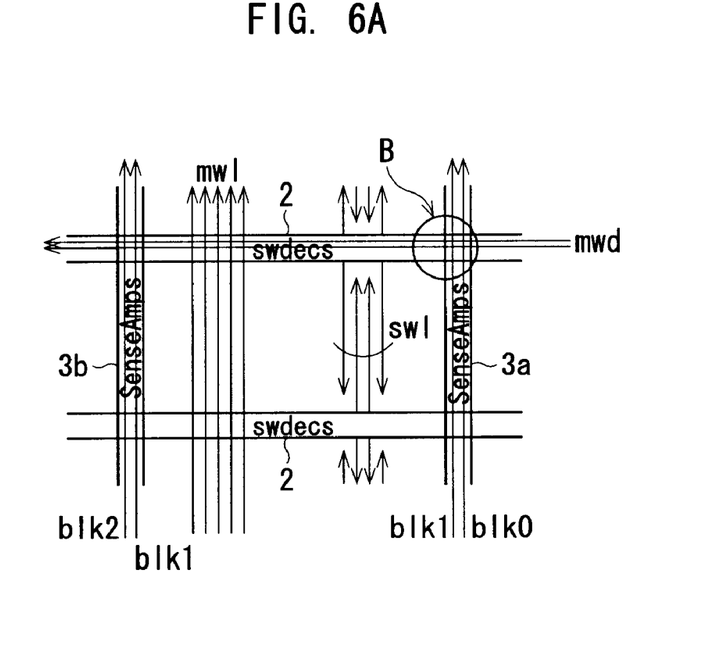
FIGS. 6A and 6B are enlarged views showing the major parts in a bank shown in FIG. 5.
Figure 6B:
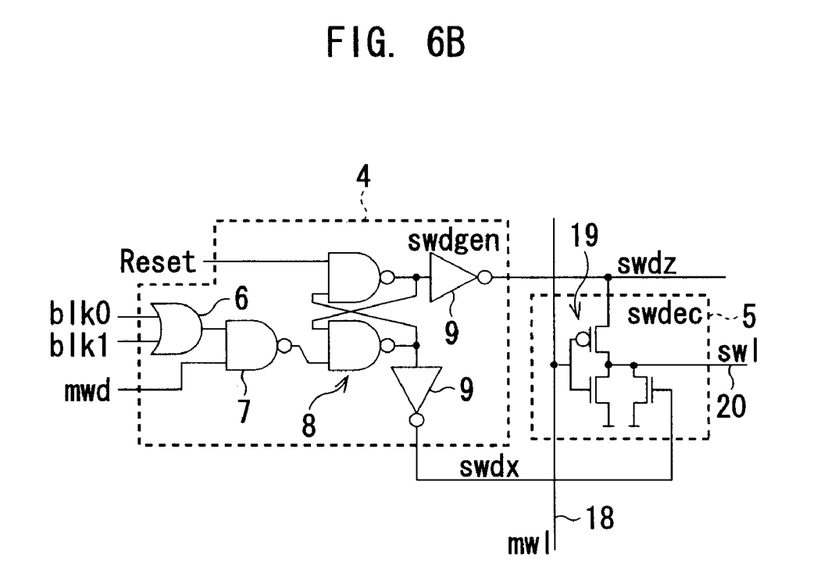

FIG. 6A is an enlarged view of the region in a circle indicated by an arrow A in the bank 10 (Bank0) shown in FIG. 5. FIG. 6B is a view showing, in a further enlarged scale, a sub-WD signal generator (swdgen) 4 and a sub-word decoder (swdec) 5 connected to this sub-WD signal generator 4, both of which are arranged in a cross portion (an SS-Cross portion in a circle indicated by an arrow B) between a sub-word decoder group (swdecs) 2 and a sense amplifier group (senseAmps) 3a or 3b.

The bank is divided into blocks (four blocks as indicated by the dotted lines in mwdec shown in FIG. 5) along the word line direction. As shown in FIG. 6A, in each block, the sub-word decoder groups 2 and the sense amplifier groups 3a and 3b run perpendicularly to each other to form cell array units. In each block, memory cells (not shown) are arranged in a lattice manner. Also, sub-select lines (swl) alternately run from the sub-decoder groups 2 on the two sides to the memory cells and connect with these memory cells in an interdigitated pattern.

The sense amplifier groups 3a and 3b oppose each other on the two sides of the region in which the memory cells are formed. Bit lines (not shown) alternately run from the sense amplifier groups 3a and 3b on the two sides to these memory cells in an interdigitated pattern. The sense amplifier groups 3a and 3b have a function of amplifying outputs from these bit lines. It is possible to select a sub-select line (swl) corresponding to a memory cell to be selected and write or read data through a bit line connected to this memory cell.

On the sense amplifier groups 3a and 3b, two block select signal lines run in the same direction as these sense amplifier groups 3a and 3b. These two block select signal lines activate block select signals corresponding to blocks, of the blocks existing in the bank, on the two sides of a specific sense amplifier in the sense amplifier groups 3a and 3b selected in accordance with a row address.

Referring to FIG. 6B, the main WD signal generator 1 shown in FIG. 5 outputs a main WD select signal (mwd) corresponding to a row address. This main WD select signal (mwd) is input to a sub-WD signal generator 4 placed in the cross portion between the sub-word decoder group 2 and the sense amplifier group 3a or 3b and corresponding to the row address.

Meanwhile, in accordance with the row address of a memory cell to be selected, block select signals blk0 and blk1 of a corresponding block are also input to the sub-WD signal generator 4. In this sub-WD signal generator 4, an OR gate 6 performs OR operation of adjacent block select signals. Therefore, when a certain sense amplifier in the sense amplifier group 3a is selected, the OR gate 6 outputs a signal "H".

The output main WD select signal from the main WD signal generator 1 and the output signal from the OR gate 6 are input to a NAND gate 7. The NAND gate 7 performs NAND operation of these signals and supplies an output signal to a latch circuit 8 of the sub-WD signal generator 4. The latch circuit 8 latches this output from the NAND gate 7 for a predetermined time until a reset signal is applied. The latched signal is inverted by an inverter 9 and output as complementary sub-WD select signals (swdx and swdz) from the sub-WD signal generator 4. A reset signal (Reset) is input to the latch circuit 8 at a predetermined timing to reset the state latched by this latch circuit 8.

The sub-WD select signals (swdx and swdz) output from the sub-WD signal generator 4 are input to sub-word decoders 5 connected to this sub-WD signal generator 4. Each sub-word decoder 5 is connected to a main select line (mwl) 18. A main word decoder 14 selects a main select line 18 corresponding to a row address by a different system from the sub-WD select signals (swdx and swdz). A signal of this main select line 18 turns on a CMOS circuit 19. Accordingly, a sub-select line (swl) 20 rises while the complementary sub-WD select signals (swdx and swdz) are applied to the sub-word decoder 5. Consequently, a memory cell connected to the activated sub-select line 20 is selected, and data write or read is performed.

Figure 7A:
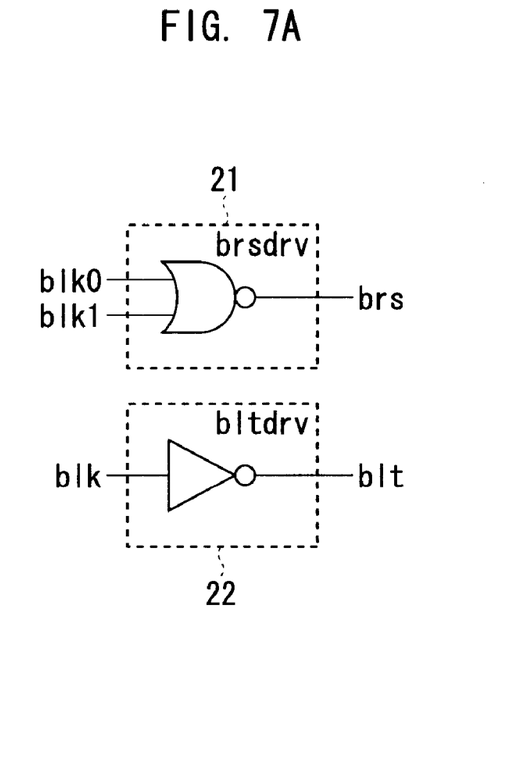
FIGS. 7A and 7B are schematic views showing the arrangement of a driver concerning a sub-select line of the SDRAM.

FIG. 7A shows the arrangement of bit line short & pre-charge control circuit (brsdrv) 21 and a bit line transfer control circuit (bltdrv) 22. These control circuits output a pre-charge release signal brs and a cell array select signal blt on the basis of a block select signal.

Figure 7B:
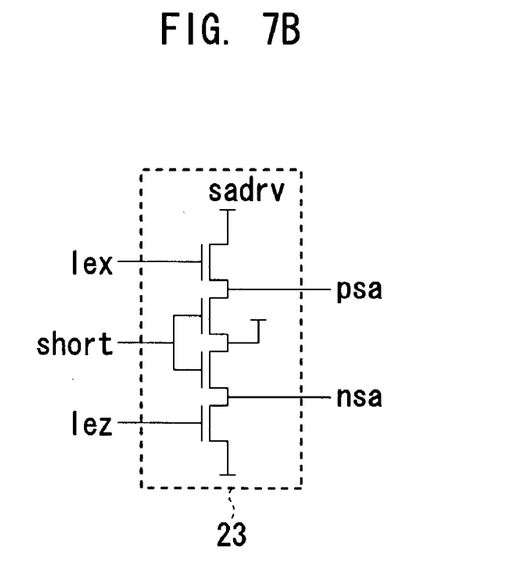

FIG. 7B shows the arrangement of a sense amplifier activating circuit (sadrv) 23. This sense amplifier activating circuit 23 is a circuit for driving a power supply for a sense amplifier. When receiving sense amplifier latch enable signals lex and lez, the sense amplifier activating circuit 23 is activated to change the sense amplifier power supply from the pre-charge state to the potential required for amplification. When sense amplifier activation signals psa and nsa output from the sense amplifier activating circuit 23 part from each other (one rises to "H" and the other falls to "L"), a sense amplifier amplifies the micro-potential of a bit line.

Figure 8:
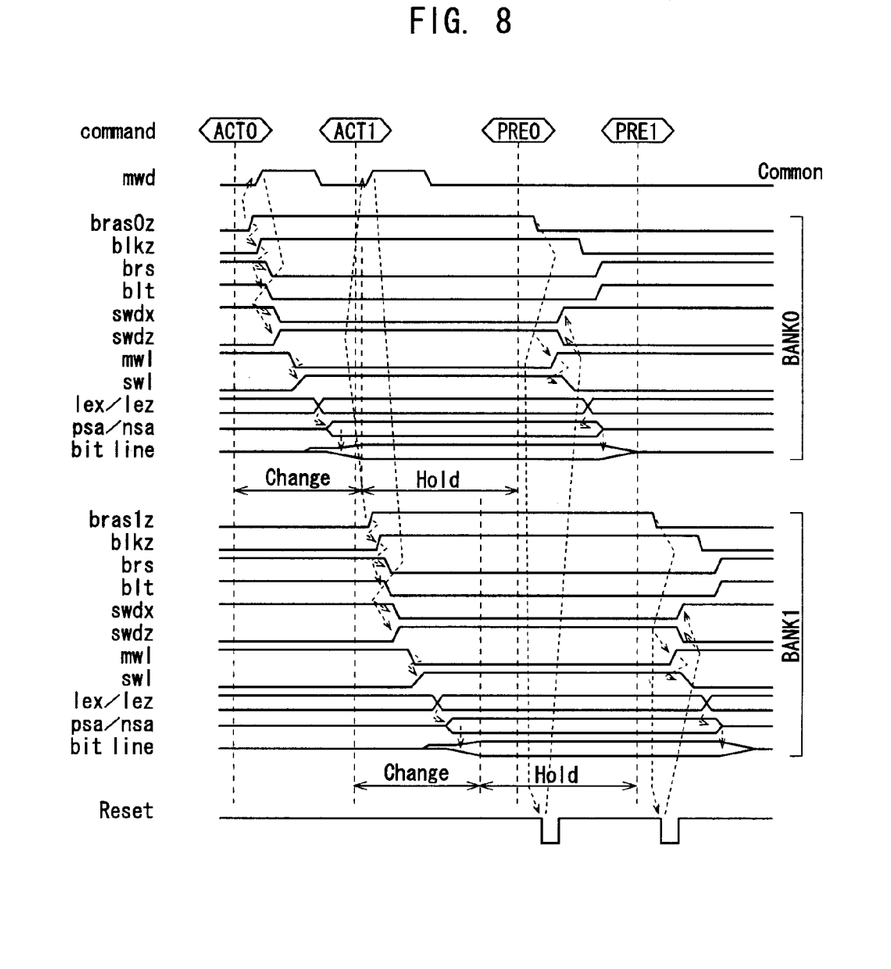
FIG. 8 is a timing chart showing the operations of signals in two banks.

The output timings of signals for controlling the bank 10 (Bank0) and the bank 11 (Bank1) will be described below with reference to FIG. 8. FIG. 8 is a timing chart, similar to FIG. 4, showing outlines of the waveforms of major signals when commands are executed in the order of "Bank0 active, Bank1 active, Bank0 pre-charge, and Bank1 pre-charge".

As shown in FIG. 8, the common main WD signal generator 1 of all banks supplies the main WD select signal (mwd) as a common pulse signal of the banks 10 and 11. The banks 10 and 11 are controlled on the basis of this signal. In response to a status signal brasz indicating whether the bank is in the active state or the pre-charge state, a pulse of the main WD select signal (mwd) selected by a row address rises.

First, signals for controlling the bank 10 will be explained. A status signal bras0z indicates the status of control of a block in the bank. This status signal bras0z switches to a selected state (Hi state) in response to an active command (ACT0) to the bank 10 and to a non-selected state (Lo state) in response to a pre-charge command to the bank 10. When this status signal bras0z switches to "H", a logical operation is performed for the row address loaded simultaneously with the command. Consequently, a block select signal blkz corresponding to a sense amplifier block to be selected and the first pulse of the main WD select signal rise.

In response to the rise of this block select signal blkz, a pre-charge release signal brs falls. This pre-charge release signal brs controls a pre-charge transistor of a bit line and is output from the bit line transfer control circuit 21 shown in FIG. 7A. When this pre-charge release signal brs falls, a bit line to be accessed is shorted and released from pre-charge, and preparations for receiving data are made in a sense amplifier.

Also, in response to the rise of the block select signal blkz described above, a cell array select signal blt falls. This cell array select signal blt is used to select one of cell arrays arranged on the two sides of a certain sense amplifier group, and is output from the bit line transfer control circuit 22 shown in FIG. 7B. The cell array select signal blt controls a transfer gate for controlling the connection between a sense amplifier and a cell array. That is, in the pre-charge state, cell arrays on the two sides are connected to a sense amplifier. When a block select signal is output, the cell array select signal blt switches to "L" to disconnect a cell array of a block not to be selected.

When the main WD select signal (mwd) and the block select signal blkz rise, the sub-WD signal generator 4 shown in FIGS. 6A and 6B logically operates these two signals. This activates the complementary sub-WD select signals (swdx and swdz) output from the sub-WD signal generator 4. As shown in FIG. 8, the state of the activated sub-WD select signals is latched by the latch circuit 8 until a reset signal is input in accordance with input of a pre-charge command.

Meanwhile, by a system different from these sub-WD select signals (swdx and swdz), on the basis of the status signal bras0z a logical operation is performed for the row address of a memory cell to be selected by the main word decoder 14 to select one main select line (mwl). Upon selection, the output from this main select line (mwl) switches to "L".

As described above, the output from the main select line (mwl) changes to "L" to activate the sub-WD select signals (swdx and swdz). Consequently, the sub-word decoder 5 selects a desired sub-select line (swl), and its signal rises. Since the sub-select line (swl) is selected, information stored in the memory cell is output from a bit line selected by another column address.

A sense amplifier latch enable signal lex/lez is a sense amplifier control signal. The sense amplifier activating circuit 23 shown in FIG. 7B generates a sense amplifier activation signal psa/nsa. This sense amplifier activation signal psa/nsa is supplied to a sense amplifier to amplify a micro-potential of a bit line. This makes it possible to read out information stored in the memory cell. A signal "bit line" indicates the output read out from the memory cell into the sense amplifier.

When the bank 10 starts reading out data, the bank 11 receives an active command (ACT1). In response to this command, a status signal bras1z rises in the bank 11. In response to this rise, a logical operation is performed for the row address of a memory cell to be selected, and a block select signal blkz corresponding to a sense amplifier block to be selected and the second pulse of the main WD select signal (mwd) rise.

When the main WD select signal (mwd) and the block select signal (blkz) thus rise, the sub-WD signal generator 4 shown in FIGS. 6A and 6B logically operates these two signals. This activates the complementary sub-WD select signals (swdx and swdz) output from the sub-WD signal generator 4, as in the case of the bank 10. The state of the activated sub-WD select signals is latched until a reset signal is input.

In this embodiment as described above, the main WD select signal (mwd) as the output from the main WD signal generator 1 is a pulse signal generated when an active command of any of the four banks 10 to 13 is received. Also, the latch circuit 8 for latching the state of the sub-WD select signals (swdx and swdz) is inserted into the sub-WD signal generator 4. Consequently, the sub-WD select signals (swdx and swdz) from each of the banks 10 to 13 can be controlled by the pulse-like main WD select signal (mwd) output from one main WD signal generator 1. Additionally, although the main WD select signal (mwd) is a pulse signal, the active state of the sub-WD select signals (swdx and swdz) can be maintained. Accordingly, it is possible to share the main WD select signal (mwd) by all the banks and share the main WD signal generator 1 by the four banks 10 to 13 to perform bank independent operations.

Since the main WD signal generator 1 is shared, the area occupied by this main WD signal generator 1 can be greatly reduced. Also, lines related to input addresses to the main WD signal generator 1 can be combined into one line, and this reduces the area occupied by the line. Furthermore, the driving load can be reduced because only one main WD signal generator 1 is necessary and the wiring can be shortened.

The main WD signal generator 1 is placed in substantially the center of the whole region of the banks 10 to 13 sharing this circuit. Therefore, the longest distance of a line from the driving circuit to the end can be shortened. Consequently, a preferable result can be obtained in respect of the operating speed compared to a memory in which banks are continuously arranged and the main WD signal generator 1 is placed at the end of these banks.

In this embodiment, the latch circuit 8 maintains the active state of the sub-WD select signals (swdx and swdz). However, this active state can also be maintained by using another circuit. Also, the main WD signal generator 1 can be shared by any arbitrary number of banks, rather than by all the banks 10 to 13.

What is claimed is:

1. A semiconductor memory comprising:
   a plurality of banks, each of which includes memory cells and a latch circuit; and
   a word line drive circuit selecting one of word lines in said banks in response to first and second select signals produced in accordance with an address,
   wherein said first select signal is a pulse signal, and the state of said second select signal which, if changed in response to a state change of said first select signal, is maintained for a predetermined time in said latch circuit.

2. The semiconductor memory according to claim 1, wherein a first circuit shared by said banks supplies said first select signal to each bank.

3. The semiconductor memory according to claim 2, wherein said first circuit is disposed in substantially the center of the whole region where said banks are arranged.

4. The semiconductor memory according to claim 1, wherein said latch circuit is set in an active state by application of the pulse signal, and maintains the active state until an initiation of a pre-charge operation in said banks.

5. The semiconductor memory according to claim 4, wherein said latch circuit is formed in a second circuit for generating said second select signal.

6. The semiconductor memory according to claim 4, further comprising:
   a second circuit for generating said second select signal;
   a sense amplifier for driving a bit line connected to said memory cells; and
   a word decoder for activating said desired word line in response to said second select signal,
   and wherein said latch circuit is formed in said second circuit.

7. A semiconductor memory device, comprising:
   a plurality of memory banks; and
   a common word driver circuit commonly disposed for said plurality of memory banks, for generating a first selection signal in response to a first address;
   each of said memory banks includes;
   memory cells coupled to sub word lines;
   a main word decoder for selecting a main word line in response to a second address;
   a sub word signal generator having a latch circuit which activates a sub word selection signal in response to said first selection signal; and a sub word decoder for selecting one of said sub word lines in response to said sub word selection signal and said selected main word line.

8. The semiconductor memory device according to claim 7, wherein said latch circuit is reset by a reset signal in response to a precharge command.

9. The semiconductor memory device according to claim 7, wherein said first selection signal is a pulse signal and is generated in response to an active command.

10. The semiconductor memory device according to claim 7, said sub word decoder comprising:
   a PMOS transistor and a NMOS transistor connected in series between a signal line receiving said sub word selection signal and a reference potential line, whose common gates are connected to said main word line, and a connection node between said PMOS and NMOS transistors being coupled to said sub word line; and
   a second NMOS transistor coupled between said sub word line and said reference potential line, that is controlled by a compliment signal of said sub word selection signal.

11. The semiconductor memory device according to claim 7, each of said memory banks further comprising:
   a plurality of sense amplifier columns each including a plurality of sense amplifiers; and
   a plurality of sub word decoder rows each including said sub word decoder;
   wherein said sub word signal generator is disposed in a cross area between said sense amplifier columns and said sub word decoder rows.

12. The semiconductor memory device according to claim 11, wherein each of memory banks is divided into a plurality of memory blocks by said sense amplifier columns, and said sub word signal generator activates said sub word selection signal in response to said first selection signal and a block selection signal designating one of said memory blocks.

13. The semiconductor memory device according to claim 12, wherein said sub word signal generator receives two block selection signals designating adjacent two memory blocks.

* * * * *